(12) United States Patent
Park et al.

(10) Patent No.: US 8,431,442 B2
(45) Date of Patent: Apr. 30, 2013

(54) METHODS OF MANUFACTURING SEMICONDUCTOR CHIPS

(75) Inventors: Sang Wook Park, Hwaseongi-si (KR); Tae Gyeong Chung, Suwon-si (KR); Ho Geon Song, Suwon-si (KR); Won Chul Lim, Asan-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 51 days.

(21) Appl. No.: 13/253,425

(22) Filed: Oct. 5, 2011

(65) Prior Publication Data

US 2012/0115307 A1    May 10, 2012

(30) Foreign Application Priority Data

Nov. 5, 2010 (KR) .......................... 10-2010-0110032

(51) Int. Cl.
*H01L 21/00* (2006.01)

(52) U.S. Cl.
USPC ..... 438/113; 438/114; 438/462; 257/E21.599

(58) Field of Classification Search .................. 438/113, 438/114, 462; 257/E21.599
See application file for complete search history.

(56) References Cited

U.S. PATENT DOCUMENTS

| | | | |
|---|---|---|---|
| 7,566,635 B2 | 7/2009 | Fujii et al. | |
| 7,642,113 B2 * | 1/2010 | Kurosawa | 438/33 |
| 2005/0272224 A1 * | 12/2005 | Ueda et al. | 438/460 |
| 2006/0163699 A1 * | 7/2006 | Kumakawa et al. | 257/620 |
| 2009/0011572 A1 | 1/2009 | Kaneko | |
| 2009/0107967 A1 | 4/2009 | Sakamoto et al. | |
| 2010/0015782 A1 * | 1/2010 | Yu et al. | 438/463 |
| 2010/0261335 A1 * | 10/2010 | Andry et al. | 438/462 |

FOREIGN PATENT DOCUMENTS

| | | |
|---|---|---|
| JP | 2007-013056 | 1/2007 |
| JP | 2007-235069 | 9/2007 |
| JP | 4358762 B2 | 8/2009 |

* cited by examiner

*Primary Examiner* — Trung Q Dang
(74) *Attorney, Agent, or Firm* — Volentine & Whitt, PLLC (57) ABSTRACT

A method of manufacturing semiconductor chips includes providing a semiconductor substrate including circuit regions, irradiating the semiconductor substrate with a laser beam onto to form a frangible layer, and polishing the semiconductor substrate to separate the circuit regions of the semiconductor substrate from one another into semiconductor chips. The frangible layer may be removed completely during the polishing of the semiconductor substrate.

20 Claims, 7 Drawing Sheets

METHODS OF MANUFACTURING SEMICONDUCTOR CHIPS

CROSS-REFERENCE TO RELATED APPLICATIONS

This U.S. non-provisional patent application claims priority under 35 U.S.C. §119 to Korean Patent Application No. 10-2010-0110032, filed on Nov. 5, 2010, in the Korean Intellectual Property Office, the entire contents of which are hereby incorporated by reference.

BACKGROUND

The inventive concept relates generally to the manufacturing of semiconductor chips. More particularly, the inventive concept relates to the process of dividing a substrate, such as a semiconductor wafer, into individual semiconductor chips.

Semiconductor chips may be manufactured by forming circuit regions including target circuits on a bare wafer, polishing a back side of the bare wafer, and cutting the polished bare wafer to separate the circuit regions from each other. The polished wafer can be cut mechanically using a saw blade, but such mechanical sawing may induce cracks in the semiconductor chips. In this case, the semiconductor chips can break while being transferred.

SUMMARY

According to one aspect of the inventive concept, there is provided a method of manufacturing semiconductor chips, comprising: providing a semiconductor substrate having demarcated circuit regions, irradiating the semiconductor substrate with a laser beam to form a frangible layer in the semiconductor substrate, and stressing the frangible layer to the point at which the semiconductor substrate fractures by polishing the semiconductor substrate.

According to another aspect of inventive concept, there is provided a method of manufacturing semiconductor chips, comprising: forming circuits at regions of a front side of a semiconductor substrate, wherein the regions are demarcated by a scribe lane extending therebetween, irradiating the substrate with a laser beam along the scribe lane to form a frangible layer in the semiconductor substrate, and polishing a back side of the semiconductor substrate in such a way as to cause the frangible layer of the semiconductor substrate to fracture and divide the substrate into semiconductor chips.

According to another aspect of the inventive concept, there is provided a method of fabricating semiconductor chips, comprising: providing a semiconductor substrate having an array of spaced apart circuit regions at a front side thereof, irradiating the semiconductor substrate with a laser beam to damage portions of the substrate located substantially between the circuit regions as viewed in plan, and subsequently polishing the semiconductor substrate at the back side thereof in such a way as to cause the damaged portions of the substrate to fracture the substrate.

BRIEF DESCRIPTION OF THE DRAWINGS

The inventive concept will be more clearly understood from the following brief description of preferred embodiments thereof made with reference to the accompanying drawings.

DETAILED DESCRIPTION OF THE PREFERRED EMBODIMENTS

Various embodiments and examples of embodiments of the inventive concept will be described more fully hereinafter with reference to the accompanying drawings. In the drawings, the sizes and relative sizes and shapes of elements, layers and regions shown in section may be exaggerated for clarity. In particular, the cross-sectional illustrations of the semiconductor devices and intermediate structures fabricated during the course of their manufacture are schematic. Also, like numerals are used to designate like elements throughout the drawings.

Furthermore, spatially relative terms, such as "upper," "lower," "front" and back", are used to describe an element's and/or feature's relationship to another element(s) and/or feature(s) as illustrated in the figures. Thus, the spatially relative terms may apply to orientations in use which differ from the orientation depicted in the figures. Obviously, though, all such spatially relative terms refer to the orientation shown in the drawings for ease of description and are not necessarily limiting as embodiments according to the inventive concept can assume orientations different than those illustrated in the drawings when in use.

Other terminology used herein for the purpose of describing particular examples or embodiments of the inventive concept is to be taken in context. For example, the terms "comprises" or "comprising" when used in this specification specifies the presence of stated features or processes but does not preclude the presence or additional features or processes.

[Methods of Manufacturing Semiconductor Chips]

Hereinafter, a method of manufacturing semiconductor chips according to the inventive concept will be described with reference to FIGS. 1 through 6.

Figure 1:
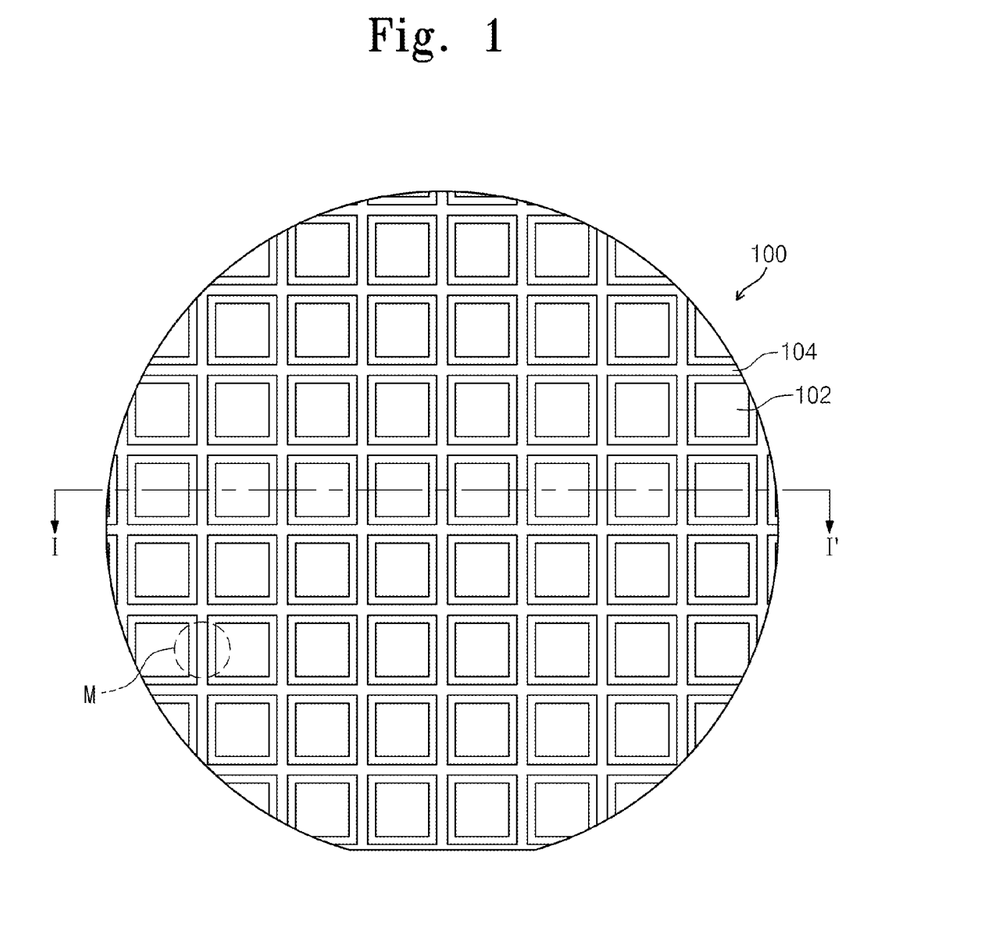
FIG. 1 is plan views of substrate used in the manufacturing semiconductor chips according to the inventive concept.
Figure 2:
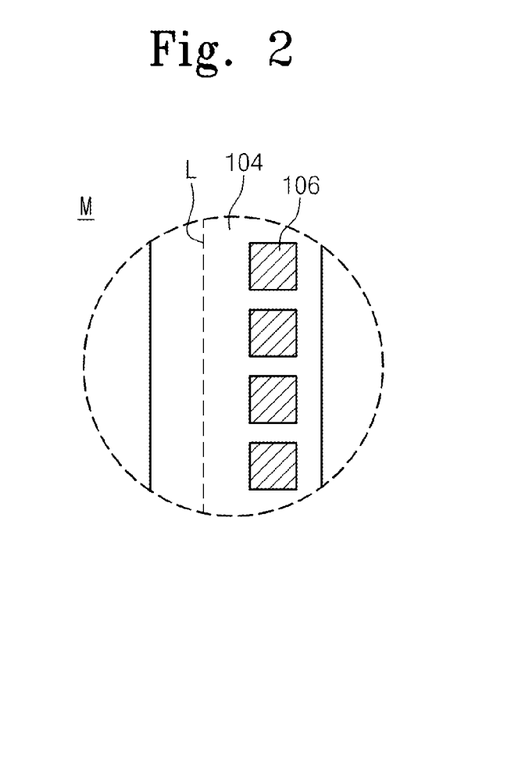
FIG. 2 is a plan view of portion M of the substrate in FIG. 1, showing an enlarged view of a section of the scribe lane of the substrate.

Referring first to FIGS. 1 and 2, a semiconductor substrate 100, having circuit regions 102, is prepared.

The semiconductor substrate 100 may be a bare or SOI type of wafer. At this stage, the semiconductor substrate 100 has a first thickness T1 (FIG. 3).

The circuit regions 102 are formed at a front side of the semiconductor substrate 100. Each of the circuit regions 102 may include integrated circuits, each of which may be a memory circuit or a non-memory circuit (e.g., a logic circuit). In the case in which the circuit regions 102 contain memory circuits, the memory circuits may comprise a volatile or non-volatile random access memory device, such as a DRAM, SRAM, FLASH memory device, PRAM, ReRAM or MRAM. In the case in which the circuit regions 102 contain non-memory circuits, the non-memory circuits may comprise a memory control circuit, an application processing circuit, a power supply circuit, a modem circuit, or a radio frequency circuit.

Referring to FIG. 2, a scribe lane 104 is disposed between the circuit regions 102. That is, the circuit regions 102 are spatially separated from each other by the scribe lane 104. Furthermore, an interconnection structure which electrically connects electronic elements to each in the circuit regions 102 may be provided. In this example, in which such an interconnection structure is provided, the interconnection structure is realized by patterning at least one metal layer, e.g., a layer of aluminum (Al) or copper (Cu), formed on the front side of the wafer. In this example, the patterned metal layer includes metal patterns 106 disposed in the scribe lane 104.

Figure 3:
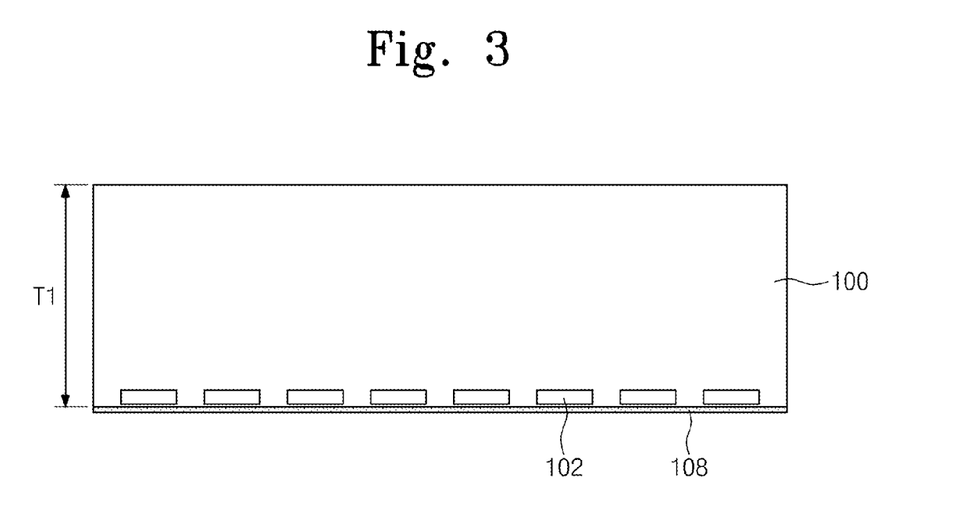
FIGS. 3 through 6 are cross-sectional views illustrating a method of manufacturing semiconductor chips according to the inventive concept.

Referring to FIG. 3, a protective sheet 108 is attached on the front side of the semiconductor substrate 100. The protective sheet 108 prevents the circuit regions 102 from being damaged by subsequent processes.

Figure 4:
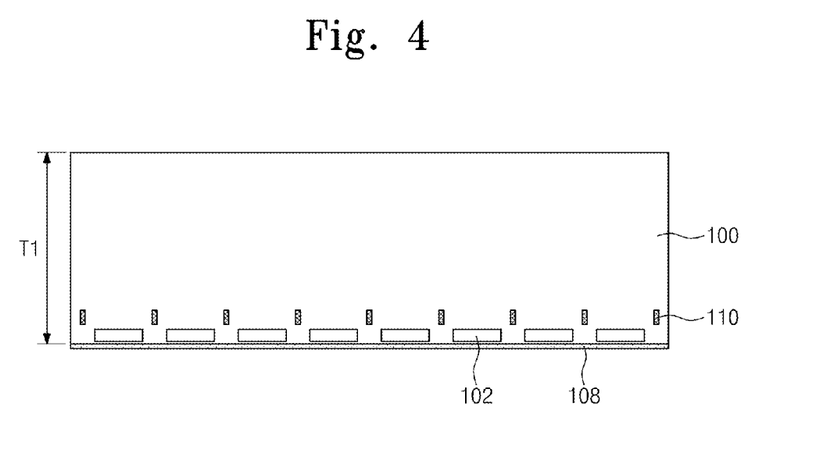

Referring to FIG. 4, a frangible layer 110 is then formed in the semiconductor substrate 100.

In the illustrated embodiment, the frangible layer 110 is constituted by damaged or weakened spots of the substrate 100 formed locally under the scribe lane 104. As will become clearer from the description that follows, the damaged or weakened spots may include crack sites which trigger brittle fractures when subjected to an external physical impact. Furthermore, the scribe lane 104 is irradiated by a laser bean to form the damaged or weakened spots of the frangible layer 110. In the example of the present embodiment illustrated in FIG. 2, in which the metal patterns 106 are disposed in the scribe lane 104, the substrate 100 is irradiated by the laser beam along a line L outside the metal patterns 106.

The damaged or weakened spots of the frangible layer 110 can be easily formed at intended regions in the semiconductor substrate 100 because the laser beam can be easily controlled, in terms of its energy level, direction of propagation, etc. to irradiate intended regions. Thus, the frangible layer 110 may be spaced apart from both of the rear and front surfaces of the semiconductor substrate 100. That is, the frangible layer 110 may be disposed entirely below the surface of the semiconductor substrate 100.

In this example, as well, the distance from the frangible layer 110 (i.e., from the damaged or weakened spots of the frangible layer 110) to the back surface of the semiconductor substrate 100 is greater than the distance from the frangible layer 110 to the front surface of the semiconductor substrate 100. Moreover, the frangible layer 110 may be spaced from bottom surfaces of the lowermost features (e.g., field isolation patterns or well regions) of electronic elements disposed in the circuit regions 102. In this case, the frangible layer 110 can be fully removed by a back-side polishing process, which will now be described with reference to FIGS. 5 and 6.

Figure 5:
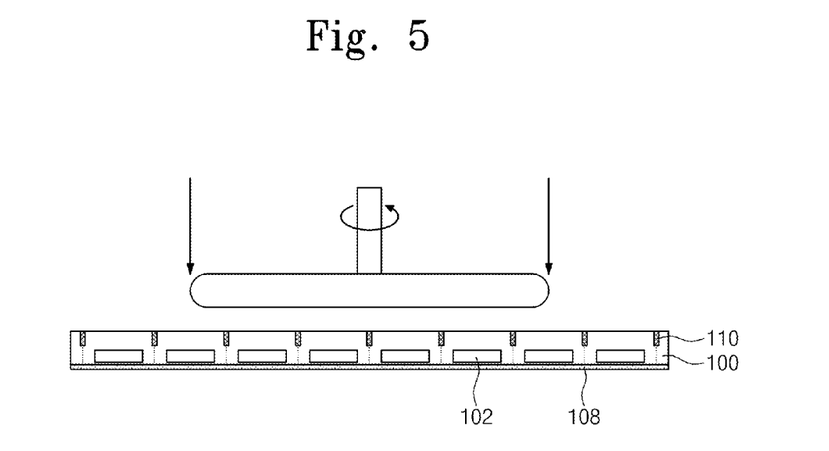
Figure 6:
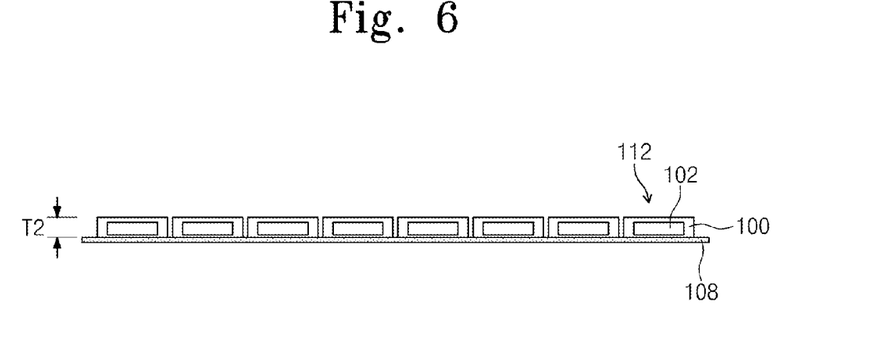

Referring to FIGS. 5 and 6, the back side of the semiconductor substrate 100 is polished. As a result, the circuit regions 102 of the semiconductor substrate 100 are separated from each other into a plurality of semiconductor chips 112. The semiconductor chips 112 have a thickness T2 that is substantially less than the original thickness T1 of the semiconductor substrate 100. For example, the second thickness T2 of the semiconductor chips 112 is in the range of about 20 μm to about 50 μm.

According to one example of the inventive concept, the back side polishing of the semiconductor substrate 100 comprises mechanically grinding the back side of the semiconductor substrate 100, such that the substrate 100 is under physical pressure. For example, the back side polishing may be a back lap process or a chemical mechanical polishing process.

Back side polishing performed under a physical pressure causes brittle fracturing of the semiconductor substrate 100 as the thickness of the semiconductor substrate 100 is decreased gradually. Brittle fracturing refers to a phenomenon in which an object cleaves, without any permanent deformation, when subjected to an external force beyond its elastic limit. In the embodiment of the inventive concept described above, the back side polishing process readily causes the semiconductor substrate 100 to brittlely fracture due to the crack sites (weakened or damaged spots) in the frangible layer 110. The circuit regions 102 may be neatly separated from each other by the brittle fracturing of the semiconductor substrate 100 because the crack sites are formed in the scribe lane 104 between the circuit regions 102. The protective sheet 108 can prevent the divided circuit regions 102 from moving relative to one another as they are separated.

As mentioned above, the back side polishing of the semiconductor substrate 100 may be performed until the frangible layer 110 is completely removed.

The sidewalls of the semiconductor chips 112, formed by the cleaving of the substrate 100, are of better quality and lower roughness than if they had been made by a saw blade. Furthermore, in the case in which the frangible layer 110 is completely removed by the back side polishing process, the semiconductor chips 112 will have substantially no crack sites therein, i.e., in their individual substrates. Accordingly, the semiconductor chips 112 are not susceptible to being broken during a subsequent transferring of the semiconductor chips 112.

In addition, in cases in which the damaged or weakened spots of the frangible layer 110 are aligned with the scribe lane 104 but are located laterally with respect to the metal patterns 106, the damaged or weakened spots may be narrower than the width of the scribe lane 104. Accordingly, metal residue or metal fragments can be prevented from being produced when the semiconductor substrate 100 is cleaved by the back side polishing process. Thus, chip failures otherwise caused by metal residue or fragments stuck to the circuit regions 102, can be prevented. Furthermore, the use of laser allows the width of the scribe lane 104 to be minimized. Thus, more circuit regions 102 can be provided and hence, more chips can be obtained from one semiconductor substrate (wafer).

[Semiconductor Package]

Figure 7:
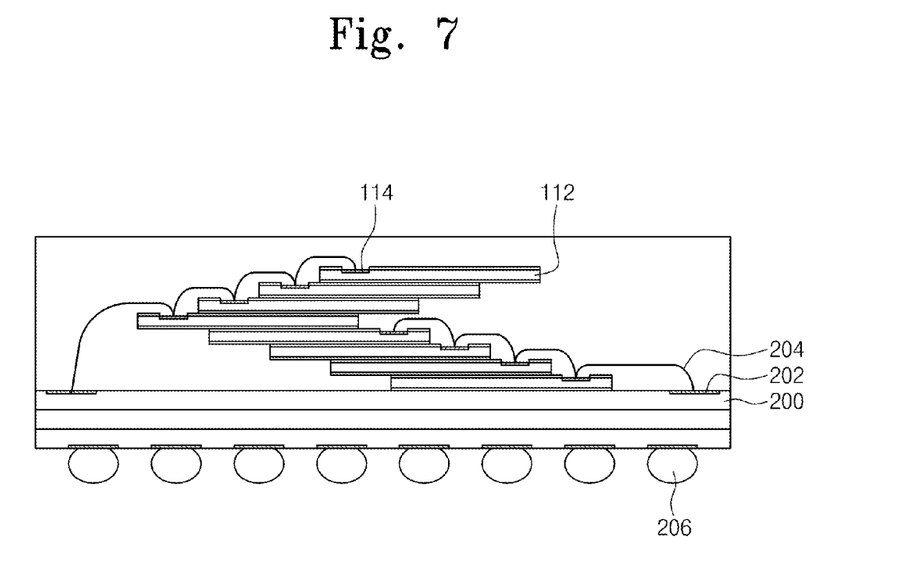
FIG. 7 is a cross-sectional view of a semiconductor package having chips fabricated according to the inventive concept.

FIG. 7 illustrates an embodiment of a semiconductor package fabricated according to the inventive concept.

The semiconductor package includes a printed circuit board 200, a plurality of semiconductor chips 112, electrical connection structure 204, and a molding element 208. The semiconductor chips 112 of the package are manufactured by a method described with reference to FIGS. 1 to 6. Thus, the semiconductor chips 112 and hence, the package, have all of the advantages described above in connection with the forming of the chips 112 according to the inventive concept.

The semiconductor chips 112 are mounted to the printed circuit board 200. For example, the semiconductor chips 112 are sequentially stacked one atop the other on a front surface of the printed circuit board 200. In addition, at least one first pad 202 may be provided at the front surface of the printed circuit board 200.

Each of the semiconductor chips 112 may include a second pad 114 connected electrically to a respective first pad 202. In the illustrated example of this embodiment, the semiconductor chips 112 are vertically stacked in a stepwise manner, such that the second pads 114 are exposed in the stack of semiconductor chips 112.

More specifically, in this example, the semiconductor package has eight semiconductor chips 112, the divided into two groups, namely first and second groups of four semiconductor chips 112 each. In each of the first and second groups, the four semiconductor chips 112 are horizontally offset from one another to such an extent that each chip 112 exposes the respective second pad 114 of the chip 112 disposed thereunder. However, the direction of the horizontal offset may be different between the first and second groups, as shown in the figure. For example, the first group may form steps leading upward and to the left, and the second group may form steps leading upward and to the right and thus, the eight semiconductor chips 112 form a 'V'-shaped structure.

The electrical connection structure 204 is configured to electrically connect the first pads 202 and the second pads 114. That is, the printed circuit board 200 is connected to the semiconductor chips 112 via the electrical connection structure 204. For example, the electrical connection structure 204 comprises bonding wires.

The molding element 208 covers the semiconductor chips 112 and the connection patterns 204 on the printed circuit board 200. To this end, the molding element 208 may be formed of an epoxy resin. In addition, the semiconductor package may further include outer terminals 206. The terminals 206 are electrically connected to the semiconductor chips 112 by means of the printed circuit board including the first pads 202, and the electrical connection structure 204.

[Experiments]

Figure 8:
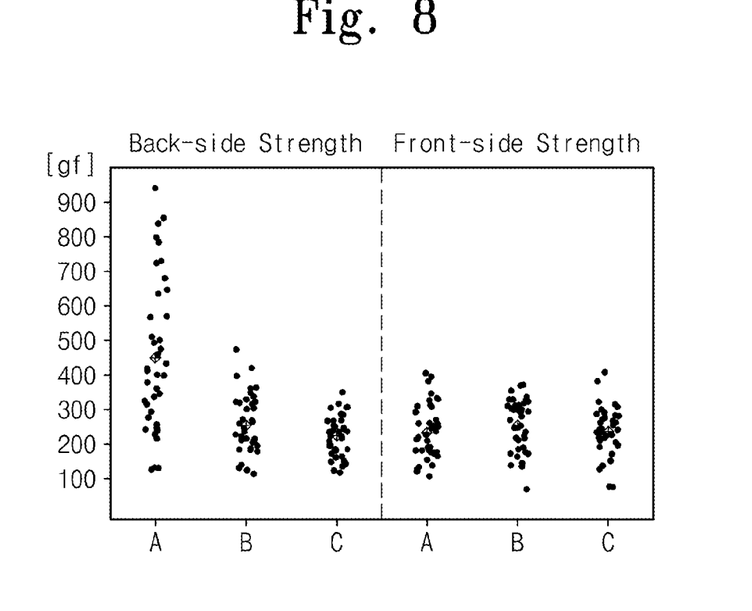
FIGS. 8 and 9 are graphs illustrating back- and front-side strengths of the semiconductor chips fabricated according to the inventive concept and according to other methods.
Figure 9:
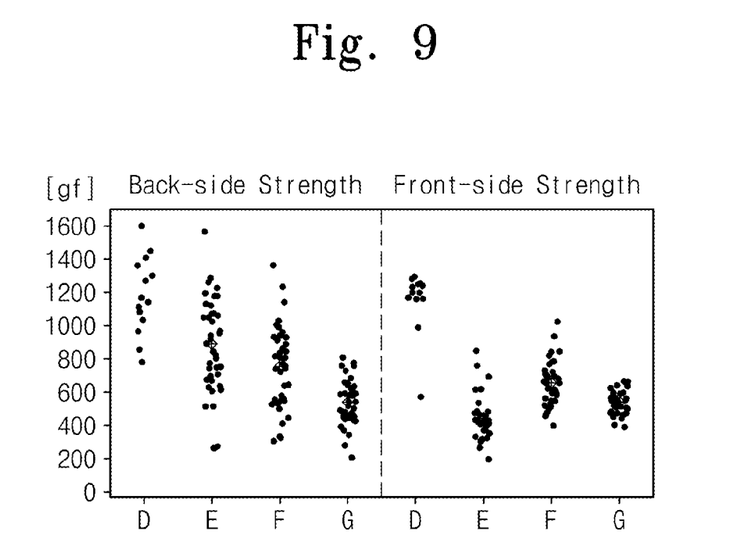

FIGS. 8 and 9 are graphs illustrating back- and front-side strengths of the semiconductor chips.

More specifically, in FIG. 8, A, B, and C represent groups of semiconductor chips fabricated using different methods and hence, the graph shows the distributions of back- and front-side strengths for semiconductor chips fabricated using different methods. The semiconductor chips of the groups A, B, and C all had the same thickness of about 30 μm.

Furthermore, the semiconductor chips of group A were fabricated using a method according to the inventive concept. Specifically, the semiconductor chips of group A had the laser-created frangible layer removed completely by a back side polishing process. As shown in the graph, the mean of the back-side strengths was about 448 gf (gram-force) and the mean of the front-side strengths was about 232 gf.

The semiconductor chips of group B were fabricated by sawing a semiconductor substrate, having a thickness of 750 μm, to a depth of about 300 μm using a blade, and then grinding the back side of the semiconductor substrate. For the semiconductor chips of group B, the mean of the back-side strengths was about 252 gf and the mean of the front-side strengths was about 253 gf.

The semiconductor chips of group C were fabricated by grinding a back side of the semiconductor substrate, and then sawing the semiconductor substrate using a saw blade to divide it into the semiconductor chips. For the semiconductor chips of group C, the mean of the back-side strengths was about 223 gf and the mean of the front-side strengths was about 235 gf.

In summary, the back-side strengths of the semiconductor chips of group A were about 1.8 times higher than those of the semiconductor chips of group B and were about 2.0 times higher than that of the semiconductor chips of group C. From these results, it can be concluded that the fabricating of semiconductor ships according to the inventive concept obviates the problem of the chips becoming cracked or broken as the result of their transfer or otherwise receiving an external impact.

Likewise, in FIG. 9, D, E, F and G represent groups of semiconductor chips fabricated using different methods and hence, the graph shows the distributions of back- and front-side strengths for semiconductor chips fabricated using different methods. The semiconductor chips of the groups D to G had the same final thickness of about 60 μm.

The semiconductor chips of group D were fabricated using the aforementioned method, according to the inventive concept, described with respect to group A. For the semiconductor chips of group D, the mean of the back-side strengths was about 1196 gf and the mean of the front-side strengths was about 1164 gf.

The semiconductor chips of group E were fabricated using a laser to produce a frangible layer in a semiconductor substrate, but the frangible layer was not removed in the process of fabricating the chips. For the semiconductor chips of group E, the mean of the back-side strengths was about 885 gf and the mean of the front-side strengths was about 442 gf.

The semiconductor chips of the group F were fabricated by sawing a semiconductor substrate, having a thickness of 750 μm, to a depth of about 300 μm using a saw blade, and then grinding the back side of the semiconductor substrate. For the semiconductor chips of group F, the mean of the back-side strengths was about 751 gf and the mean of the front-side strengths was about 652 gf.

The semiconductor chips of the group G were fabricated by grinding a back side of a semiconductor substrate and then sawing the semiconductor substrate using a saw blade to divide it into the semiconductor chips. For the semiconductor chips of group G, the mean of the back-side strengths was about 537 gf and the mean of the front-side strengths was about 536 gf.

In summary, the back-side strengths of the semiconductor chips of group D were about 1.4, about 1.6, and about 2.2 times higher than those of the semiconductor chips of groups E, F, and G, respectively. And the front-side strengths of the semiconductor chips of group D were about 2.6, about 1.8, and about 2.2 times higher than those of the semiconductor chips of groups E, F, and G, respectively. Given that the front-side strengths of the semiconductor chips of group D were about 2.6 times higher than those of the semiconductor chips of group E, it can be concluded that laser-induced damaged layer is one of factors increasing fragileness of semiconductor chip.

[Applications]

Figure 10:
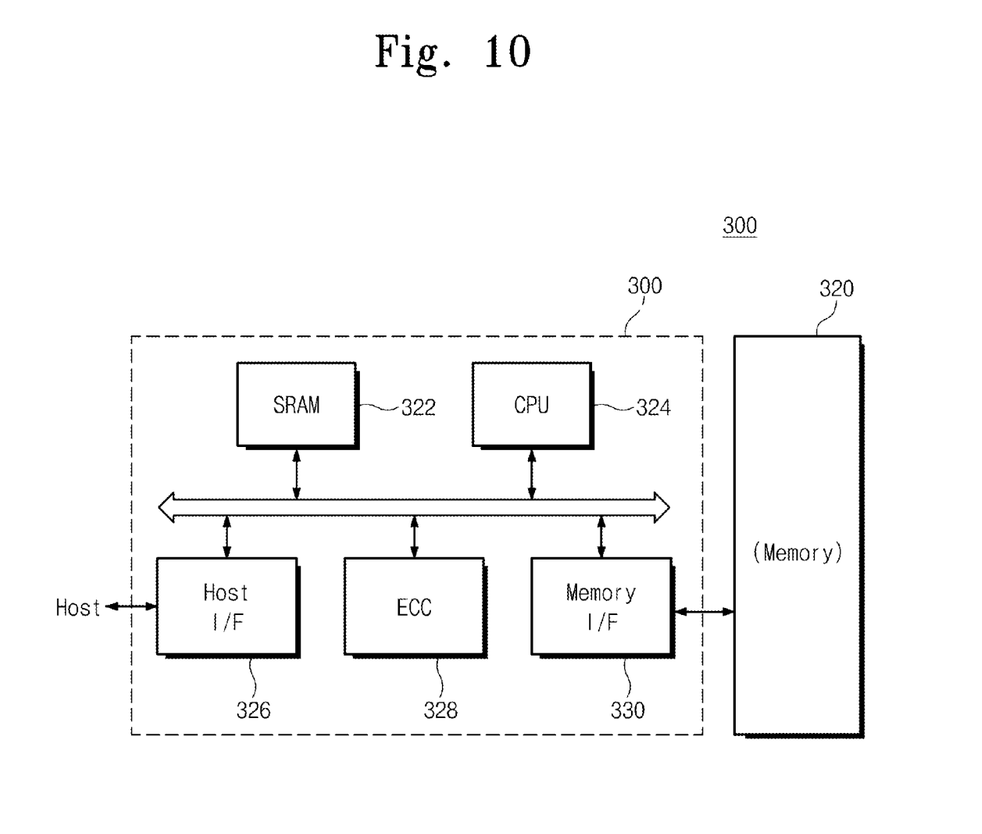
FIG. 10 is a block diagram of a memory card that can be fabricated using a method according to the inventive concept.

FIG. 10 illustrates a memory card including a memory device fabricated according to the inventive concept.

Referring to FIG. 10, the memory card 300 of this example includes a semiconductor memory 310, and a memory controller 320 to control a data exchange between a host and the semiconductor memory 310. The memory controller 320 includes a central processing unit (CPU) 324, a static random access memory (SRAM) 322, a host interface 326, an error correction code (ECC) 328, and a memory interface 330.

The static random access memory (SRAM) 322 serves as an operation memory of the central processing unit (CPU) 324a. The host interface 326 provides data exchange protocol of the host to be connected to the memory card 300. The error correction code (ECC) 328 can detect and correct at least one error in data read from the semiconductor memory 310. The memory interface 330 provides the interface between the semiconductor memory 310 and the semiconductor memory 310. The central processing unit (CPU) 324 can control data exchange between the memory controller 320 and the semiconductor memory 310, for example.

The semiconductor memory 310 of the memory card 300 includes semiconductor chips or semiconductor packages having chips fabricated according to the inventive concept, and thus possesses all of the attendant advantages associated therewith as described above.

Figure 11:
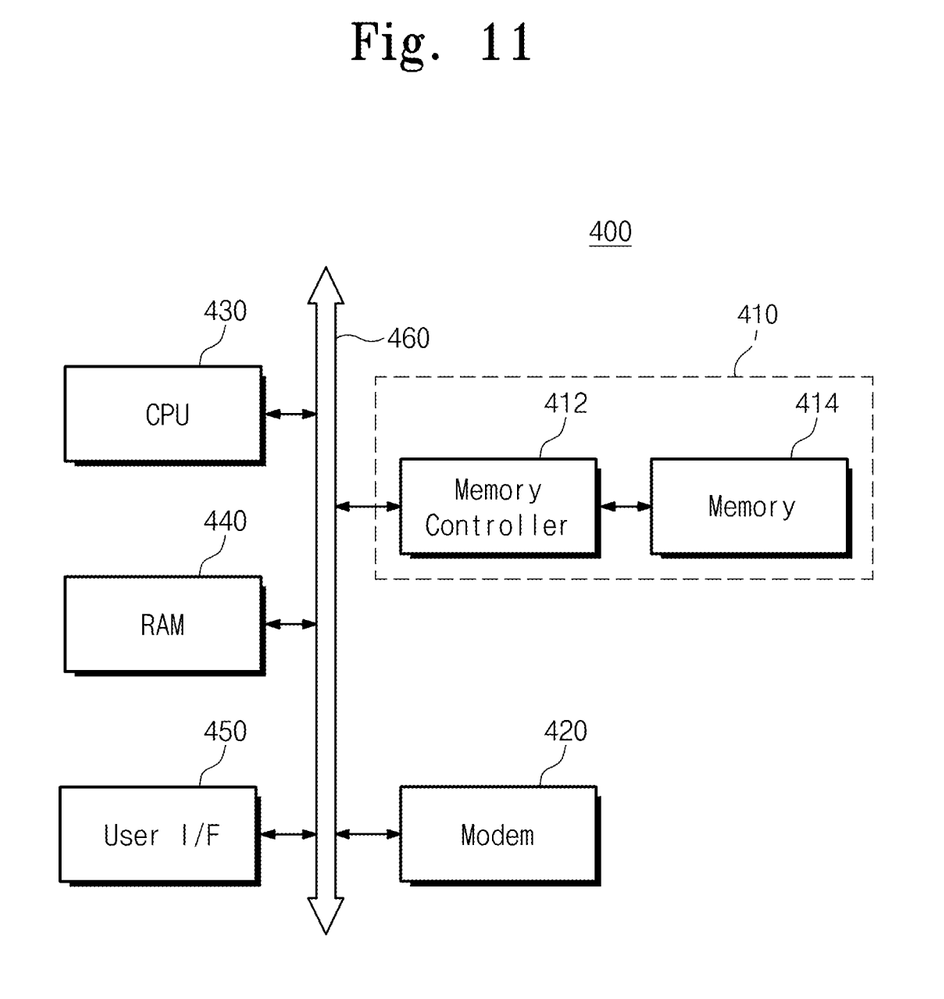
FIG. 11 is a block diagram of an information processing system that can be fabricated using a method according to the inventive concept.

FIG. 11 illustrates an embodiment of an information processing system 400 having chips fabricated according to the inventive concept. The information processing system 400 may be that of a mobile device or a computer. Furthermore, the information processing system 400 may be in the form of a memory card, a solid state drive, a camera image sensor or an application chip set.

In this example, the information processing system 400 includes a memory system 410, a modem 420, a central processing unit (CPU) 430, a random access memory (RAM) 440, and a user interface 450 that are electrically connected to a system bus 460. The memory system 410 may store data processed by the central processing unit (CPU) 430 and data inputted from the outside (e.g., via the user interface 450 and/or the modem 420). The memory system 410 may include a memory 412 and a memory controller 414. The memory system 410 thus may be a memory card similar to that described with reference to FIG. 10. That is, in this example, the memory 414 includes semiconductor chips fabricated according to the inventive concept.

According to the inventive concept as described above, a laser is used to form a frangible layer, including so-called "crack sites" in a semiconductor substrate. Due to the crack sites, the semiconductor substrate can be easily divided into several semiconductor chips by a subsequent back-side polishing process.

In one embodiment, the laser-produced frangible layer is removed completely during the back-side polishing process. Accordingly, it is possible to quickly and reliable produce relatively strong semiconductor chips, i.e., chips which are not susceptible to being broken when handled, transferred or packaged.

In addition, the use of a laser allows the semiconductor substrate to cleave exactly at intended regions during the back-side polishing process. Accordingly, the semiconductor substrate can be neatly divided into the semiconductor chips, and sidewalls of the semiconductor chip have lower roughness than sidewalls produced by sawing a substrate.

In cases in which a metal pattern exists in the scribe lane, the substrate may be irradiated in the scribe lane but laterally of the metal patterns. Thus, metal residue or fragments can be prevented from being generated.

Also, according to an aspect of the inventive concept, the use of a laser allows the width of the scribe lane to be minimized. Thus, more semiconductor chips can be obtained from the semiconductor substrate.

Finally, embodiments and examples of the inventive concept have been described above in detail. The inventive concept may, however, be embodied in many different forms and should not be construed as being limited to the embodiments and examples described above. Rather, these embodiments were described so that this disclosure is thorough and complete, and fully conveys the inventive concept to those skilled in the art. Thus, the true spirit and scope of the inventive concept is not limited by the embodiments or examples described above but by the following claims.

What is claimed is:

1. A method of manufacturing semiconductor chips, comprising
    providing a semiconductor substrate having demarcated circuit regions;
    irradiating the semiconductor substrate with a laser beam to form a frangible layer in the semiconductor substrate; and
    stressing the frangible layer to the point at which the semiconductor substrate fractures by polishing the semiconductor substrate.

2. The method of claim 1, wherein the substrate has opposite front and back sides, and the circuit regions are located at the front side of the semiconductor substrate, and the polishing of the semiconductor substrate comprises polishing the back side of the semiconductor substrate.

3. The method of claim 1, wherein the irradiating of the semiconductor substrate is controlled to form the fragile layer between front and back surfaces of the semiconductor substrate.

4. The method of claim 3, wherein the polishing of the semiconductor substrate is carried out until the fragile layer is completely removed.

5. The method of claim 4, wherein the semiconductor substrate has a scribe lane demarcating the circuit regions, and the irradiating of the semiconductor substrate with the laser beam comprises irradiating the substrate along the scribe lane.

6. The method of claim 5, wherein the providing of the semiconductor substrate comprises forming metal patterns in the scribe lane, and the irradiating of the semiconductor substrate comprises directing the laser beam along the portion of the scribe lane at which the metal patterns are formed but laterally of the metal patterns.

7. The method of claim 1, wherein the polishing of the semiconductor substrate comprises grinding the semiconductor substrate while exerting physical pressure on the semiconductor substrate.

8. The method of claim 1, wherein the polishing of the semiconductor substrate is performed until the substrate has a thickness within a range of about 20 μm to about 50 μm.

9. A method of manufacturing semiconductor chips, comprising:
    forming circuits at regions of a front side of a semiconductor substrate, wherein the regions are demarcated by a scribe lane extending therebetween;
    irradiating the substrate with a laser beam along the scribe lane to form a frangible layer in the semiconductor substrate; and
    polishing a back side of the semiconductor substrate in such a way as to cause the frangible layer of the semiconductor substrate to fracture and divide the substrate into semiconductor chips.

10. The method of claim 9, wherein the polishing of the semiconductor substrate is carried out until the fragile layer is completely removed.

11. The method of claim 9, wherein the irradiating of the semiconductor substrate is controlled to form the fragile layer between front and back surfaces of the semiconductor substrate.

12. The method of claim 11, wherein the polishing of the semiconductor substrate is carried out until the fragile layer is completely removed.

13. The method of claim 11, wherein the diameter of the laser beam is substantially smaller than the width of the scribe lane.

14. A method of manufacturing semiconductor chips, comprising:

providing a semiconductor substrate having opposite front and back sides, and an array of circuit regions at the front side, wherein the circuit regions are spaced from one another;

irradiating the semiconductor substrate with a laser beam to damage portions of the substrate located substantially between the circuit regions as viewed in plan; and subsequently polishing the semiconductor substrate at the back side thereof in such a way as to cause the damaged portions of the substrate to fracture the substrate.

15. The method of claim 14, wherein the polishing of the semiconductor substrate is carried out until the damaged portions are completely removed.

16. The method of claim 14, wherein the irradiating of the semiconductor substrate is controlled to form the damaged portions between front and back surfaces of the semiconductor substrate.

17. The method of claim 16, wherein the polishing of the semiconductor substrate is carried out until the damaged portions are completely removed.

18. The method of claim 14, wherein the semiconductor substrate has a scribe lane demarcating the circuit regions, and the irradiating of the semiconductor substrate with the laser beam comprises scanning the scribe lane with the laser beam.

19. The method of claim 18, wherein the providing of the semiconductor substrate comprises forming circuits in the circuit regions, respectively, and metal patterns in the scribe lane, and the irradiating of the semiconductor substrate comprises directing the laser beam along the portion of the scribe lane at which the metal patterns are formed but laterally of the metal patterns.

20. The method of claim 14, wherein the widths of the damaged portions is substantially smaller than the width of the scribe lane.

* * * * *